United States Patent [19]

Saito

[11] 4,227,238
[45] Oct. 7, 1980

[54] MOUNTING AND ELECTRICAL CONNECTION MEANS FOR OPERATION UNIT FOR ELECTRIC DEVICES

[75] Inventor: Masashi Saito, Hamamatsu, Japan

[73] Assignee: Nippon Gakki Seizo Kabushiki Kaisha, Japan

[21] Appl. No.: 942,969

[22] Filed: Sep. 18, 1978

[30] Foreign Application Priority Data

Sep. 28, 1977 [JP] Japan .................. 52-115515
Sep. 28, 1977 [JP] Japan .................. 52-129248[U]
Nov. 1, 1977 [JP] Japan .................. 52-145828[U]
Jan. 20, 1978 [JP] Japan .................. 53-4670[U]
Jan. 20, 1978 [JP] Japan .................. 53-4671[U]

[51] Int. Cl.² .................. H05K 7/18; H05K 1/14
[52] U.S. Cl. .................. 361/415; 200/296; 339/17 C; 361/348; 361/398; 361/417
[58] Field of Search .............. 200/296; 248/27.1, 27.3; 338/228; 361/331, 346, 347, 348, 350, 365, 376, 380, 393, 394, 398, 417, 419, 420, 412, 427, 428, 415, 429; 339/128, 17 C, 198 R, 198 G

[56] References Cited

U.S. PATENT DOCUMENTS

| | | | |
|---|---|---|---|
| 2,014,524 | 9/1935 | Franz | 361/398 |
| 3,514,743 | 5/1970 | Schantz | 339/128 |
| 3,706,869 | 12/1972 | Sorenson | 200/295 |
| 3,711,748 | 1/1973 | Dietz | 361/376 |
| 3,745,565 | 7/1973 | Daines | 361/331 |
| 3,820,056 | 6/1974 | Ayer | 339/198 R |
| 4,072,840 | 2/1978 | Daigle | 200/296 |
| 4,077,693 | 3/1978 | Briel, Jr. | 339/128 |

Primary Examiner—Gerald P. Tolin
Attorney, Agent, or Firm—Ostrolenk, Faber, Gerb & Soffen

[57] ABSTRACT

A number of electric operation components such as tone volume controls of an electric musical instrument are collectively carried by a common chassis preferably manufactured by press stamping which is accompanied by one or more printed circuit base blocks and easily incorporated in a front panel of an electric device. Assembly of the front panel construction on the electric device is remarkably simplified with enhanced precision in said position of the electric operation components on the front panel and reduced use of electric lead wires.

22 Claims, 21 Drawing Figures

MOUNTING AND ELECTRICAL CONNECTION MEANS FOR OPERATION UNIT FOR ELECTRIC DEVICES

BACKGROUND OF THE INVENTION

The present invention relates to an operation unit for electric devices, and more particularly relates to an operation unit adapted for mounting a number of electric operation components such as control switches, control dials and control knobs to a front panel of electric devices such as amplifiers and electric or electronic musical instruments.

In general, an electric device of the above-described type is provided with a great number of electric operation components on the front panel or panels thereof. A typical example of such arrangement is found in the front panel construction of an electronic organ which, as hereinafter described in more detail, in general has four to five sets of front panels each of which includes many electric operation components such as rotary-type volume controllers, slide-type volume controllers, push button switches and so on.

In order to assemble the front panel construction in the conventional manner, it is necessary to fix the electric operation components individually to the associated front panel of the electric device by screw fastening. In addition, there is generally appreciable clearance between a mounting aperture formed in the front panel and an electric operation component to be set to the mounting aperture. Due to presence of such large clearances, it is necessary to readjust the mounting positions of the electric operation components after the above-described mounting so that a number of electric operation components can be beautifully aligned in position on the front panel. Such individual mounting and individual adjustment of the great number of electric operation components naturally lead to enormously increased consumption of time and labor needed for assembly of the front panel construction which is obviously disadvantageous from the view point of productivity and manufacturing cost.

Further, presence of a great number of electric operation components requires use of a great number of electric lead wires for connecting same to associated electric circuit or circuits. Use of such a great number of lead wires again causes increased time and labor needed for connection work and requires enlarged space for accommodating the lead wires which can hardly be obtained on the rear side of the front panel. In addition, complicated arrangement of the great number of lead wires makes it very difficult to carry out possible faculty check after long use of the electric device. Increased number of the lead wires also cause corresponding increase in the installation cost.

SUMMARY OF THE INVENTION

It is one object of the present invention to simplify assembly of the front panel construction on electric devices having a great number of electric operation components.

It is another object of the present invention to eliminate the need for readjustment in position of electric operation components after mounting to the front panels on electric devices in assembly of the front panel construction.

It is the other object of the present invention to avoid troubles conventionally caused by use of a great number of electric lead wires for connection between electric operation components on the front panels and associated electric circuits arranged behind the front panels on electric devices.

It is a further object of the present invention to provide a front panel construction on electric devices on which a great number of various electric operation components are beautifully aligned, thereby enhancing appearance of the front panel construction.

It is a yet further object of the present invention to simplify faculty check of electric devices, especially of parts related to the front panel construction.

It is a yet further object of the present invention to lower the manufacturing cost of electric devices.

In accordance with the present invention, a plurality of electric operation components are collectively mounted to a common chassis preferably via snap engagement and the chassis is accompanied on the rear side by a printed circuit base block on which one or more prescribed printed circuits are formed. Mounting of the electric operation components to the chassis quite concurrently establishes electric connection between the operation components and the associated printed circuit. By simply fixing the chassis to the front panel on electric devices, the operation unit including the electric operation components can be totally incorporated into the front panel construction. The printed circuit base block may be made up of either a single plate portion or two or more plate portions bent against each other. Further, two or more printed circuit base blocks arranged in side-by-side relationship may be coupled to a common chassis.

DESCRIPTION OF THE PREFERRED EMBODIMENTS

As already described, the present invention is advantageously applied to electric devices such as electric or electronic musical instruments. One typical example of such practical application is shown in FIG. 1, in which the electric device takes the form of an electronic organ.

The electronic organ is in general provided on the front side thereof with a center control panel 1, an upper keyboard 2 arranged downwards and forwards of the control panel 1, upper keyboard panels 3 and 4 arranged sideways of the upper keyboard 2, a lower keyboard 5 arranged downwards and forward of the upper keyboards 2 and lower keyboard panels 6 and 7 arranged sideways of the lower keyboard 5. A number of electric components such as rotary type volume controllers, slide type volume controllers, push button switches and seesaw switches are arranged on the above-described panels 3, 4, 6 and 7, which is operable from outside of the organ, i.e. the electric device.

The electronic organ further comprises a top board 8, a music board 9 arranged upwardly of the control panel 1, a pair of side arms 10, side boards 11 and 12, an upper front board 13 arranged below the keyboard section, a lower front board 14 arranged below the upper front board 13, bottom sills 15 supporting the associated side boards 11 and 12, a knee lever 16 extending in front of the upper front board 13 below the keyboard section, an expression pedal 17 extending forwards of the lower front board 14 and a foot pedal keyboard 18.

Figure 1:
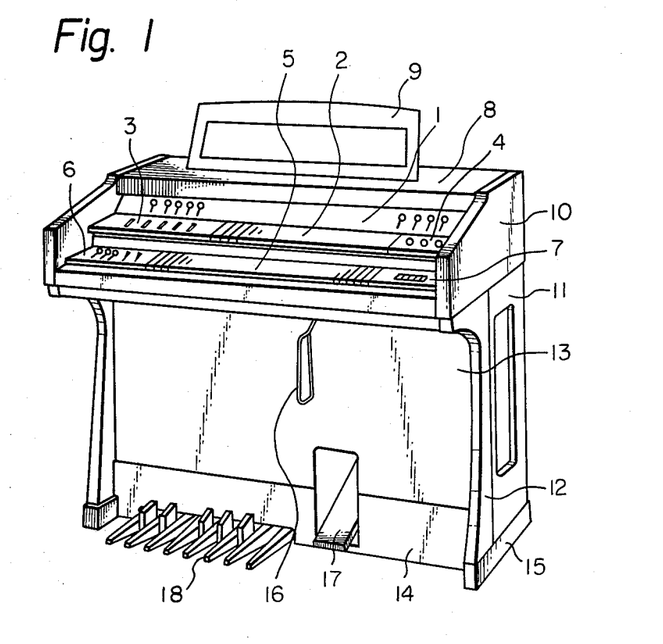
FIG. 1 is a perspective view of an electronic organ having the front panel construction to which the present invention is advantageously applied.
Figure 2:
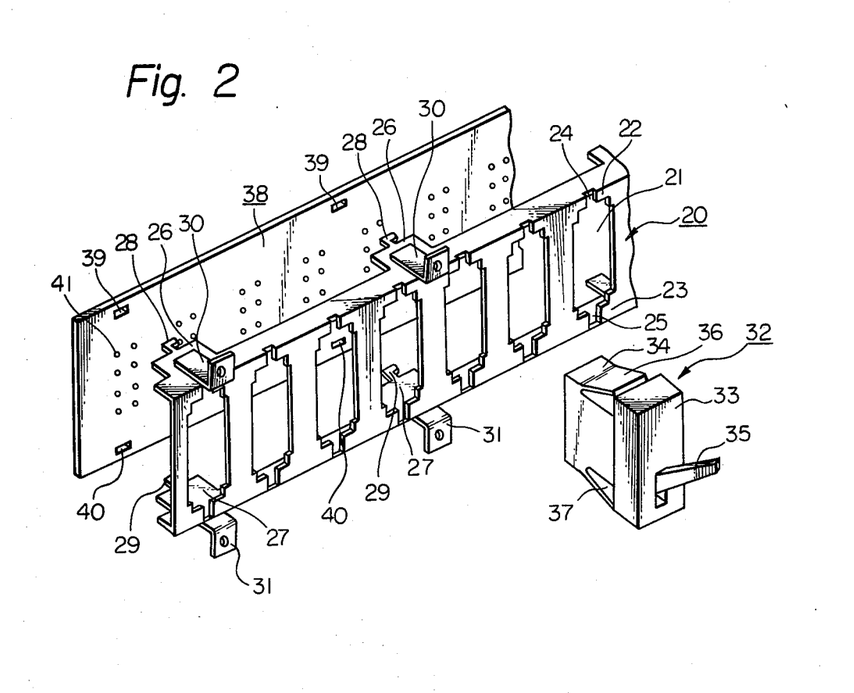
FIG. 2 is a perspective view of an embodiment of the operation unit in accordance with the present invention in a disassembled state.

A basic embodiment of the operation unit in accordance with the present invention and advantageously usable for the electric device such as shown in FIG. 1 is shown in FIG. 2 in a disassembled state.

In the illustration a chassis 20 is made by applying suitable stamping and bending to a metallic material metallic plate and provided in the front face thereof with a number of aligned mounting apertures 21 which are suitably spaced from each other. The mounting apertures 21 are substantially rectangular in shape and adapted for receiving associated electric operation components 32. Sections 22 and 23 defining upper and lower ends of each mounting aperture 21 are provided with center cut-outs 24 and 25, respectively, which extend to the upper and lower ends of the front face of the chassis 20. The chassis 20 further includes upper and lower rims bent at a right angle with respect to the front face thereof. Both rims are provided with a plurality of rear extensions 26 and 27 which are suitably spaced from each other. The rear extentions 26 and 27 are provided with rear hooks 28 and 29 each having a hooking slope. At positions corresponding to the rear extensions 26 and 27, the chassis 20 is provided with a plurality of L-shaped fixtures 30 and 31 which are fixed to the rear bent rims and extend forward of the front face of the chassis 20.

In the case of the illustrated embodiment, the electric operation component 32 is given in the form of a tone volume controller. The tone volume controller 32 includes a front portion 33 whose transverse cross sectional surface area is larger than the surface aea of the associated mounting aperture 21, and a rear portion 34 whose transverse cross sectional surface area is slightly smaller than the surface area of the associated mounting aperture 21. The front and rear portions 33 and 34 are coupled in one body to each other. The front portion 33 is provided with a movable operation lever 35 extending forward. By moving the operation lever 35, electric resistance of the electric operation component 32 is adjustable as desired. Upper and lower locking flaps 36 and 37 are formed in one body with the rear portion 34 and are resilient in nature. Under normal disposition, the ends of the skewed locking flaps 36 and 37 extend beyond the top and bottom face of the rear portion 34 of the electric operation component 32.

The operation unit in accordance with the present invention further includes a printed circuit base block 38 which takes the form of a flat plate in the case of the illustrated embodiment. The printed circuit base block 38 is provided with a number of engaging apertures 39 and 40 which are spacedly aligned with each other along the top and bottom fringe of the base block 38. The base block 38 is further provided with a number of through holes 41 adapted for receiving terminals of the tone volume controller 32 as hereinafter described in more detail.

With the above-described construction of the parts, the operation unit in accordance with the present invention is assembled in the following fashion, reference being made to FIGS. 3 and 4.

In the first place, the chassis 20 should be coupled to the printed circuit base block 38. In order to effect this coupling, the rear hooks 28 and 29 of the chassis 20 are inserted into the corresponding engaging apertures 39 and 40 of the printed circuit base block 38 and the chassis 20 is slightly slid rightward in the illustration with respect to the printed circuit base block 38, whereby the fringe portions of the engaging apertures of the base block 38 are firmly clamped by the hooking slopes of the associated rear hooks 28 and 29 and the printed circuit base block 38 is fixed to the chassis 20 as shown in FIG. 3.

In the second place, the electric operation component 32, i.e. the tone volume controller, should be coupled to the chassis 20. For this purpose, the rear portion 34 of the operation component 32 is inserted into a corresponding mounting aperture 21 of the chassis 20 so that the locking flaps 36 and 37 are locked to the sections 22 and 23 of the chassis 20. In this way, the operation component 32 can be set to the chassis 20 as shown in FIG. 4 by a single action. By this setting of the operation component 32 to the chassis 20, electric terminals of the operation component 32 are automatically inserted into the through apertures 41 of the printed circuit base block 38 as hereinafter described in more detail. In similar way, various types of electric operation components such as push button switches and seesaw switches are coupled to the operation unit in accordance with the present invention. After necessary electric operation components are all coupled to prescribed positions on the chassis 20, the chassis 20 is fixed to the corresponding front panel of the electronic organ via set screws and the fixtures 30 and 31 from the inner side of the front panel. As the number of the fixtures 30 and 31 is not so large, this screw setting does not require a great deal of labor. In addition, since the positions of the mounting apertures 21 can be fixed with high dimensional precision at the stage of press stamping, the electric operation components can be registered at finely correct positions on the chassis 20.

Figure 3:
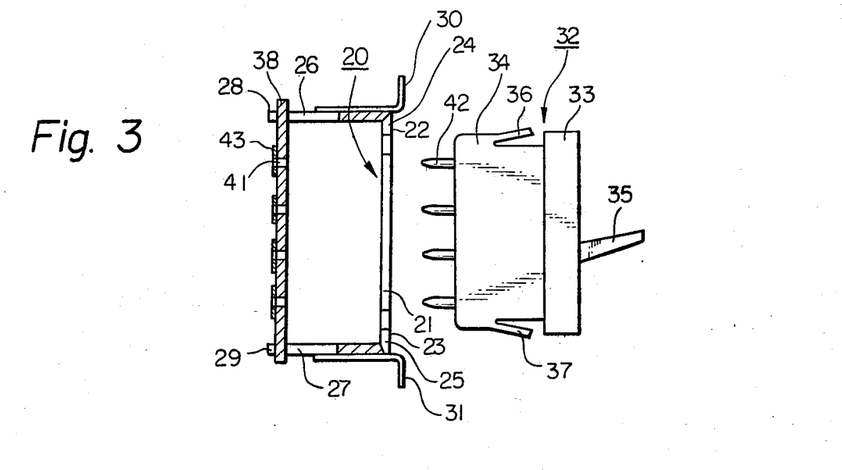
FIG. 3 is a side view, partly in section, of the operation unit with the chassis being coupled to the printed circuit base block.
Figure 4:
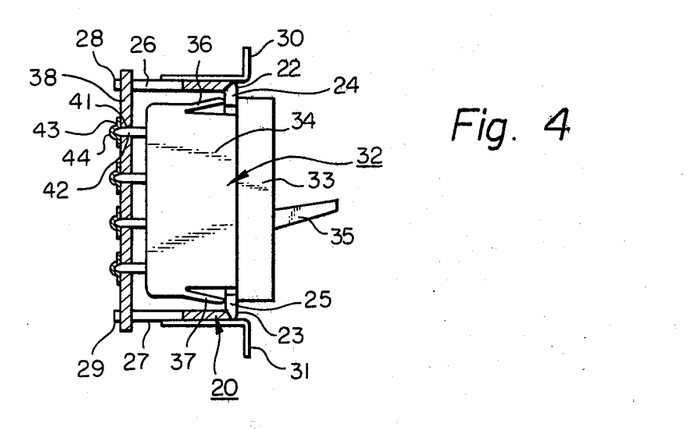
FIG. 4 is a side view, partly in section, of the operation unit in the assembled state.

Electric connection between the terminals of the electric operation component 32 and the printed circuit on the base block 38 is established as shown in FIGS. 3 and 4. The operation component 32 has a number of electric terminals 42 projecting rearwardly from the rear portion 34 thereof. The base block 38 is provided with a number of electrically conductive layers 43 which are arranged on the rear face thereof and accompany the through holes 41. The conductive layers 43 make up the prescribed printed circuit.

Since the contour of the rear portion 34 of the operation component 32 is smaller than that of the corresponding mounting aperture 21 in the chassis 20, the rear portion 34 can be very smoothly inserted into the mounting aperture 21. The skewed locking flaps 36 and 37 easily buckles due to the resilient nature thereof and do not hinder the above-described insertion. The insertion is completed as the rear end of the front portion 33 abuts the front face of the chassis 20, whereupon the locking flaps 36 and 37 resume the free state thereof so that the free ends of the locking flaps 36 and 37 engage with the back faces of the sections 22 and 23. In this way, the electric operation component 32 is firmly coupled to the chassis 20 due to the above-described locking of the locking flaps 36 and 37 with the sections 22 and 23. In order to disassemble the operation component 32 from the chassis 20, a suitable tool such as a screwdriver is inserted into the center cut-out 24 or 25 in order to release the locking flap 36 or 37 out of the engagement with the section 22 or 23.

As the operation component 32 is coupled to the chassis 20, its electric terminals 42 are inserted into the through holes 41 and, in this way, the operation component 32 and the base block 38 are mechanically coupled to each other. When the electrically conductive layer 43 has a portion annularly projecting into the through hole 41, the above-described mechanical coupling concurrently establishes electric connection between the operation component 32, e.g. the tone volume controller, and the conductive layer 43. When the conductive layer 43 does not have such an annular projection, the end of the electric terminal 42 projecting rearward of the base block 38 should be coupled to the conductive layer 43 by application of a suitable solder layer 44 shown in FIG. 4.

Figure 5:
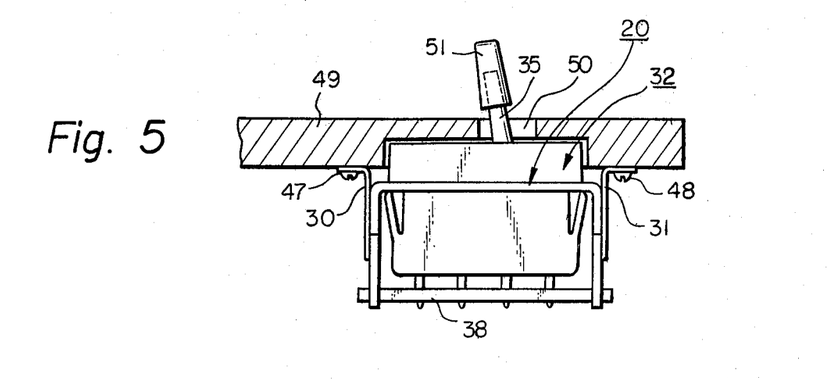
FIG. 5 is a side view, partly in section, of the operation unit in a state mounted to the front panel of the electronic organ.

One example of a mounting construction of the operation unit in accordance with the present invention to a front panel 49 of the electronic organ is shown in FIG. 5, in which the operation unit carries a tone volume controller 32 as the electric operation component. The chassis 20 is fixed to the rear face of the front panel 49 by set screws 47 and 48 via the L-shaped fixtures 30 and 31. The operation lever 35 of the tone volume controller 32 projects forward through a window 50 formed in the front panel 49 and is accompanied by a knob 52 inserted over the free end portion thereof. Other types of electric operation components are incorporated into the front panel in substantially similar manner. In order to equalize the extent of projection of various knobs on the front panel, suitable steps may be formed on the chassis or suitable washer plates may be attached to the chassis.

Figure 6:
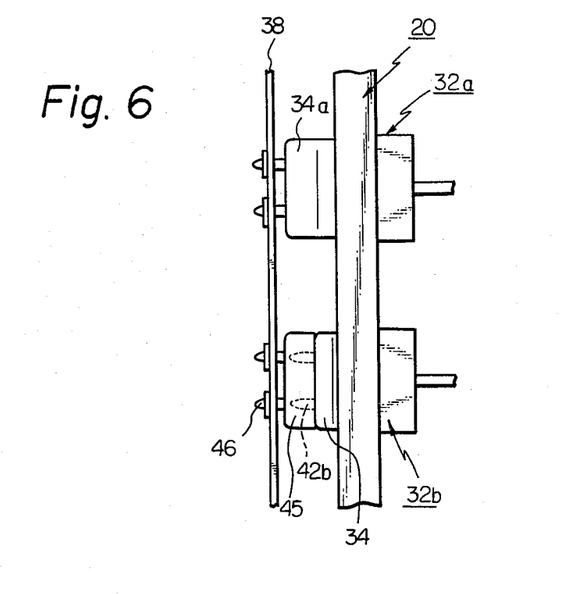
FIG. 6 is a side view of a modified embodiment of the operation unit in accordance with the present invention.

In the arrangement shown in FIG. 6, electric operation components 32a and 32b of different sizes are mounted to a common operation unit. That is, the rear portion 34a of one operation component 32a is shorter in depth than that 34b of the other operation component 32b. In order to compensate for this short depth, the shorter operation component 32b is accompanied by an auxiliary socket 45. This auxiliary socket 45 has electric terminals 46 to be electrically connected to the printed circuit on the base block 38 and is coupled to the operation component 32b via terminals 42b of the latter. Although the auxiliary socket 45 is in snug contact with the operation component 32b in the illustrated embodiment, it may be in snug contact with the base block 38 also. Use of the above-described auxiliary socket fairly absorbs variation in depth of a number of electric operation components.

Figures 7, 8:
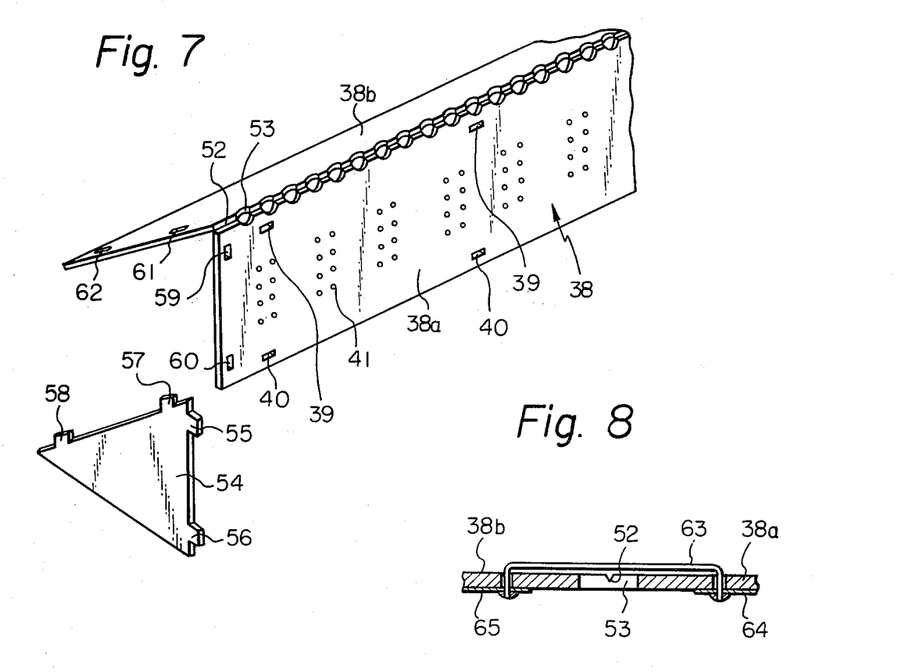
FIG. 7 is a perspective view of a modified embodiment of the printed circuit base block used for the operation unit in accordance with the present invention.
FIG. 8 is a side view, partly in section, of the printed circuit base block shown in FIG. 7 in the flat state before bending with lead wires being disposed on the base block.

In the case of the embodiment shown in FIG. 2, the printed circuit base block 38 is given in the form of a flat plate. However, for the purpose of assuring larger surface area for the printed circuit, the base block 38 may be made up of two or more sets of flat plate portions coupled to each other. One modified embodiment of the printed circuit base block of this type is shown in FIG. 7, in which the base block 38 is made up of a pair of flat plate portions 38a and 38b coupled to each other along the long fringes thereof. The one plate portion 38a provides the front face of the base block 38 and the other plate portion 38b extends rearward and downward. An elongated groove 52 is formed along the mating border between the two plate portions 38a and 38b and a number of aligned cut-outs 53 are formed in the groove 52 while being spaced from each other.

The front plate portion 38a is provided with the engaging apertures 39 and 40 formed along the top and bottom long fringes thereof, and engaging apertures 59 and 60 formed along the side short fringe thereof. The rear plate portion 38b is provided with engaging apertures 61 and 62 formed along the side short fringe thereof.

The printed circuit base block 38 is accompanied by a holder 54 which takes the form of a triangular flat plate in the case of the illustrated embodiment. The holder 54 is provided with hooking projections 55 through 58 formed on two side fringes thereof which should be inserted into the engaging apertures 59 through 62 of the plate portions 38a and 38b when the holder 54 is coupled to the base block 38. Although not shown in the illustration, a number of engaging apertures are formed in the rear plate portion 38b of the base block 38 for mounting of electric components such as resistors, capacitors and IC elements.

As the total surface area provided by the two plate portions 38a and 38b in this embodiment is by far larger than that given by the single plate construction of the base block 38 shown in FIG. 7, this embodiment is well suited for use in combination with highly complicated printed circuits.

Figures 9A, 9B, 10, 11, 12:
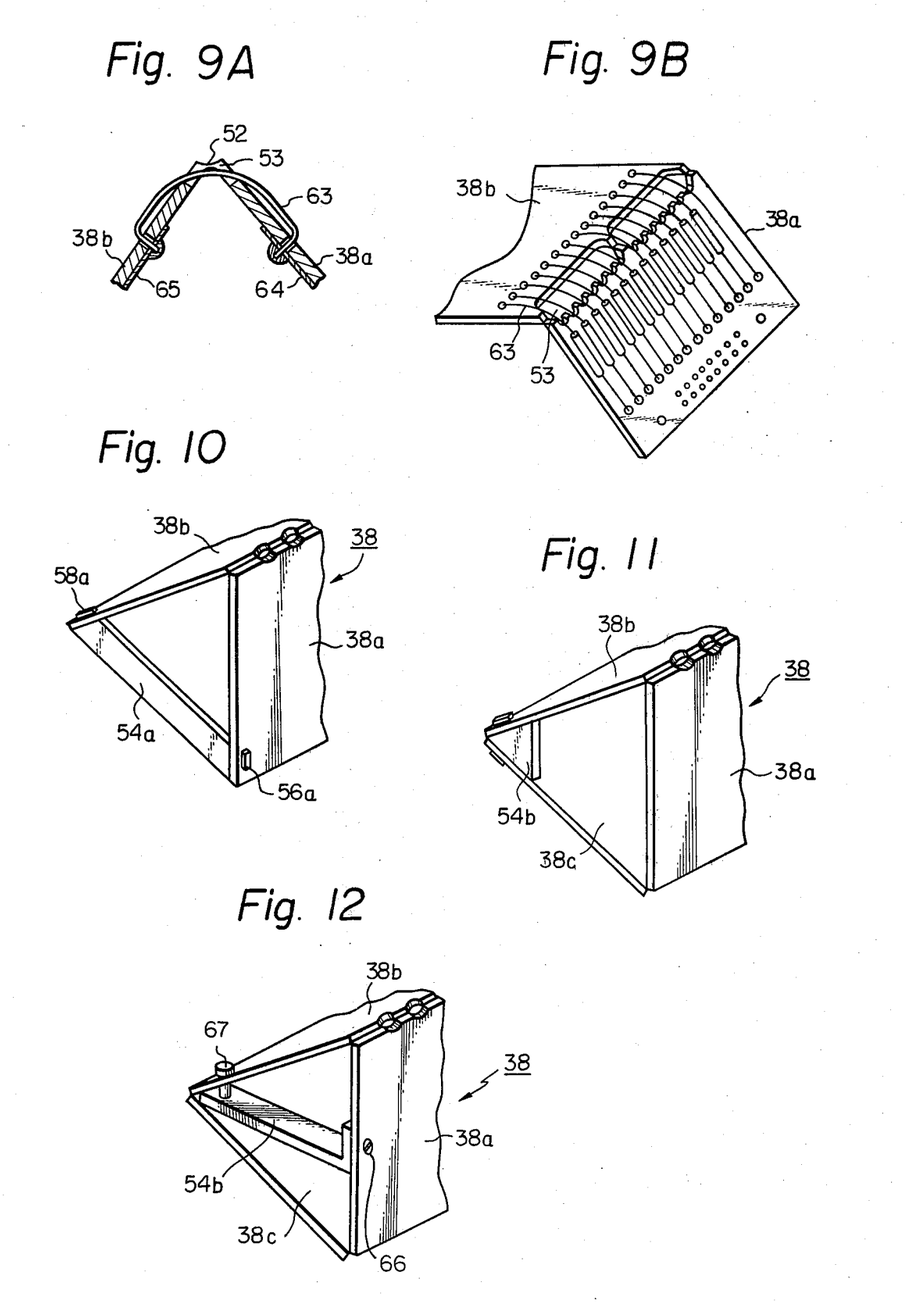
FIGS. 9A and 9B are partly sectional side and perspective views of the printed circuit base block shown in FIG. 7 in a bent state with lead wires being received in cut-offs.
FIG. 10 is a fragmentary perspective view of a modified embodiment of the holder used for the printed circuit base block shown in FIG. 7.
FIG. 11 is a fragmentary perspective view of a further modified embodiment of the printed circuit base block used for the operation unit in accordance with the prevent invention.
FIG. 12 is a fragmentary perspective view of a further modified embodiment of the printed circuit base block used for the operation unit in accordance with the present invention.

The double plate construction of the base block 38 shown in FIG. 7 can be prepared, for example, in a manner shown in FIGS. 8, 9A and 9B. Firstly, the base block 38 is given in the form of a flat plate made up of a pair of plate portions 38a and 38b which are connected to each other along the border fringes having the elongated groove 52. In this flat state, electrically conductive layers 64 on the one plate portion 38a and electrically conductive layers 65 on the other plate portion 38b are connected to each other by lead wires 63, respectively, in such a manner that the lead wires 63 run over the corresponding cut-outs 53. After the connection is complete, the plate portions 38a and 38b are bent against each other along the elongated groove 52. Then the lead wires 63 are received in the corresponding cut-outs 53 so that no unnecessary tension is imposed upon the lead wires 63 even in the bent state as shown in FIG. 9A. Since no tension is substantially imposed on the lead wires 63 by bending, it is no longer necessary to originally set the lead wires 63 in a loose state, thereby greatly simplifying original setting of the lead wires. As a substitute for the lead wires, terminal wires of electric components may be used for connection between the electrically conductive layers 64 and 65 on both plate portions 38a and 38b as shown in FIG. 9B.

A variant of the above-described triangular holder 54 is shown in FIG. 10, in which the holder 54a is given in the form of an elongated strap having hooking projections 56a and 58a on both ends which should be in engagement with the engaging apertures 60 and 62 of the printed circuit base block 38. As this strap type holder 54a leaves a triangular opening behind the side fringe of the front plate portion 38a, the rear side space defined by the two plate portions 38a and 38b can be advantageously utilized for accommodating a bundle or bundles of electric lead wires if necessary.

In a modified embodiment of the operation unit in accordance with the present invention, the printed circuit base block 38 may be made up of three sets of plate portions 38a, 38b and 38c bent against each other along the mating border fingers. When the operation unit is incorporated into the front panel of the electric device, the first plate portion 38a faces forward and is adapted for mounting of the chassis 20 and the operation components 32 as hereinbefore described, the second plate portion 38b faces upward and is adapted for mounting of various electric components, and the third plate portion 38c faces downward and is adapted for mounting of other various electric components. Rear ends of the second and third plate portions 38b and 38c are coupled to each other by a holder 54b given in the form of a small triangular piece as shown in FIG. 11. The rear side space in this embodiment is adapted for accommodating lead wires also as in the case of the foregoing embodiment.

In the embodiment shown in FIG. 12, the base block 38 is made up of the three sets of plate portions 38a, 38b and 38c bent against and coupled to each other along the border mating fringes. The holder 54b used in this embodiment is given in the form of an elongated strap which extends across the triangular opening defined by the side fringes of the three plate portions 38a, 38b and 38c. The front end of the holder 54b is fixed to the rear face of the front, i.e. the first, plate portion 38a by a set screw 66 whereas the rear end of the holder 54b is fixed to the rear ends of the second and third plate portions 38b and 38c by a fastener bolt 67. This construction also affords a rear side space adapted for accommodating lead wires.

Figure 13:
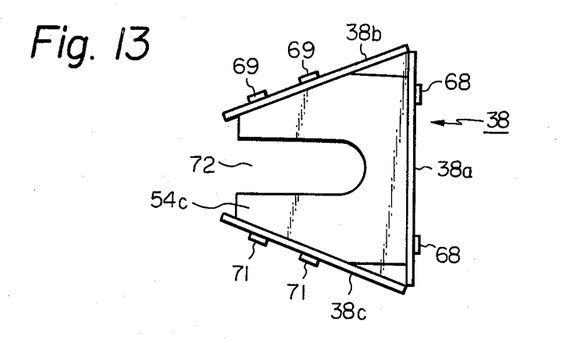
FIG. 13 is a side view of a further modified embodiment of the printed circuit base block in accordance with the present invention.

A modified embodiment of the holder shown in FIG. 13 is advantageously usable for the above described printed circuit base block made up of the three sets of plate portions. In the case of this embodiment, a holder 54c takes the form of a substantially horseshoe-shaped flat plate. The holder 54c is provided with hooking projections 68 adapted for engagement with the front side plate portion 38a, hooking projections 69 adapted for engagement with the upper plate portion 38b and hooking projections 71 adapted for engagement with the lower plate portion 38b of the base block 38. In the case of this embodiment, the rear ends of the upper and lower plate portions 38b and 38c are separated from each other and the holder 54c is provided with a cut-out 72 opening rearwards. Lead wires accommodated within the rear side space of the printed circuit base block 38 run through the above-described cut-out 72 and, when necessary, can be easily taken out of the space through the rear opening of the cut-out 72.

Figure 14:
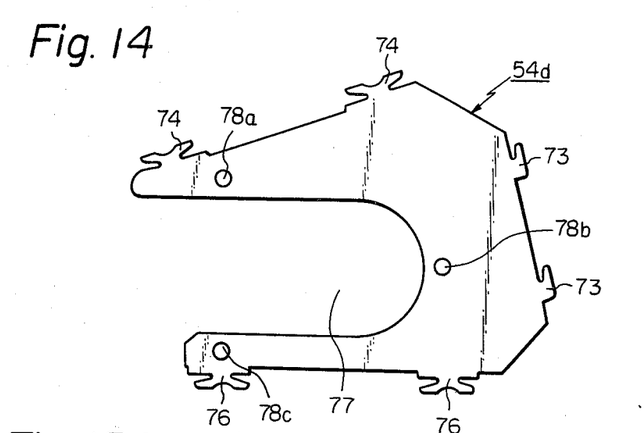
FIG. 14 is a side view of a further modified embodiment of the holder used for the printed circuit base block shown in FIG. 12, FIGS. 15A and 15B are side and sectional views of a lead wire holder to be attached to the holder shown in FIG. 14.

A variant of the above-describe horseshoe-shaped holder is shown in FIG. 14, in which a holder 54d is provided with hooking projections 73 adapted for engagement with the front plate portion 38a, hooking projections 74 adapted for engagement with the upper plate portion 38b and hooking projections 76 adapted for engagement with the lower plate portion 38c of the printed circuit base block 38. Like the foregoing embodiment, the holder 54d is provided with a deep cut-out 77 opening rearward. Three sets of mounting apertures 78a, 78b and 78c are formed around the cut-out 77.

Figure 15A:
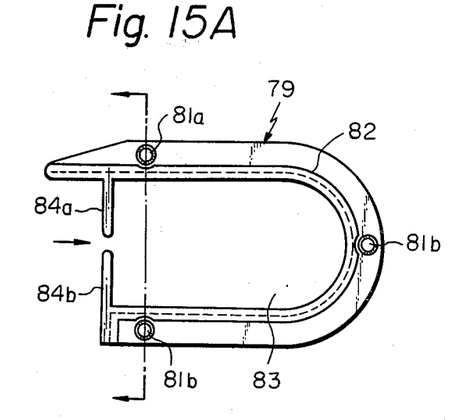
Figure 15B:
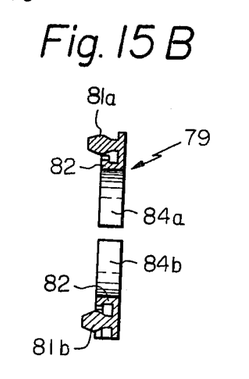

This holder 54d is used in combination with a U-shaped lead wire holder 79 shown in FIGS. 15A and 15B, in which the lead wire holder 79 is made of a resilient material such as plastics. The lead wire holder 79 is provided with three sets of hooking projections 81a, 81b and 81c at positions corresponding to the mounting apertures 78a, 78b and 78c of the holder 54d shown in FIG. 14. A U-shaped attachment 82 is disposed along the inner fringe of the lead wire holder 79 while defining a cut-out 83 opening rearwards, and is provided with lead wire hooks 84a and 84b projecting into the rear opening of the cut-out 83.

In order to assemble the holder 54d with the lead wire holder 79, the hooking projections 81a to 81c of the lead wire holder 79 are registered at and forcibly inserted into the corresponding mounting apertures 78a to 78c of the holder 54d. Concurrently with this, the attachment 82 clamps the fringe of the holder 54d defining the center cut-out 77 so that the lead wire holder 79 should be stably coupled to the holder 54d. After the holder 54d is mounted to the printed circuit base block 38, lead wires are forcibly inserted into the rear space of the base block 38 as shown with an arrow in FIG. 15A. The lead wire hooks 84a and 84b of the lead wire holder 79 easily allow this insertion due to their resilient nature on one hand and prevent undesirable falling out of the inserted lead wires from the rear space. Therefore, the lead wires can be stably held in the rear space of the printed circuit base block in ideal order.

In the case of the foregoing embodiments, the operation unit includes only one set of printed circuit base blocks. In the practical application of the operation unit, however, the operation unit may often include two or more sets of printed circuit base block coupled to each other in side by side relationship to each other. In such a case, it is preferable that the holder used for maintaining the bend construction of a base block is usable for connection between neighbouring base blocks in order to minimize the number of mechanical parts for the operation unit in accordance with the present invention.

Figure 16:
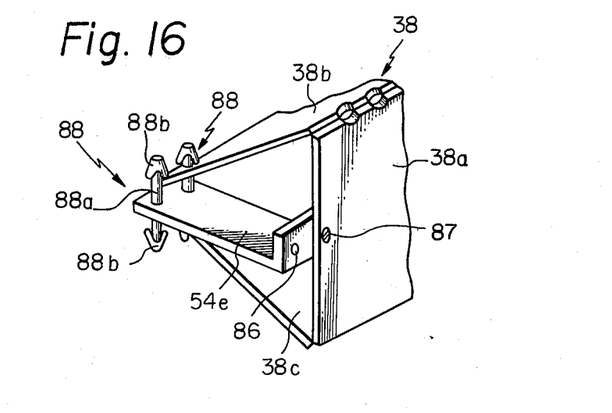
FIG. 16 is a fragmentary perspective view of a further embodiment of the printed circuit base block.

An embodiment of the holder shown in FIG. 16 is used for this purpose. In this case, a holder 54e is again given in the form of an elongated strap which is somewhat larger in width than the holer 54b used in the embodiment shown in FIG. 12. The holder 54e is provided at the front end thereof with a pair of threaded holes 86 one of which is used for coupling with the front plate portion 38a of one printed circuit base block 38 via a set screw 87 and the other of which is used for coupling with the front plate portion (not shown) of the other printed circuit base block via a like set screw. The rear end of the holder 54e is coupled to the rear ends of the upper and lower plate portions 38b and 38c of both base blocks via fasteners 88.

The fastener 88 is made of a resilient material such as plastics and includes a pole 88a and a pair of flaring end bulges 88b. In accordance with this, engaging apertures (not shown) are formed in the rear end portions of the upper and lower plate portions 38b and 38c. The contour of the engaging aperture is larger than that of the pole 88a and smaller than that of the flaring end bulge 88b of the fastener 88. Thus, by pressing the end portions of the upper and lower plate portions 38b and 38c against the end portion of the holder 54e, the fasteners 88 come into snap engagement with the corresponding engaging apertures due to their resilient nature, whereby the rear ends of the holder 54e and the plate portions 38b and 38c are firmly coupled to each other by a single finger action.

Figure 17:
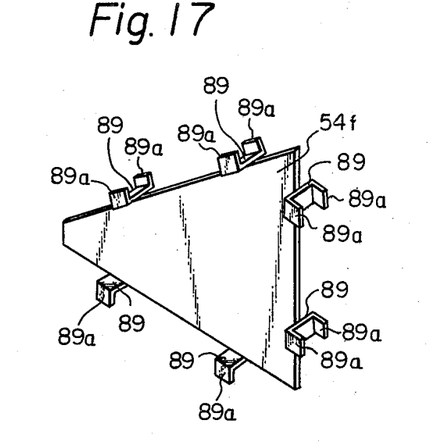
FIGS. 17 and 18 are perspective views of modified embodiments of the holder used for the printed circuit base block shown in FIG. 16.

A further modified embodiment of the holder for connecting two or more sets of printed circuit base blocks is shown in FIG. 17, in which a holder 54f is given in the form of a triangular flat plate having a pair of channel-shaped hooks 89 on every side fringe. The hook 89 has a pair of projecting rims 89a one of which is adapted for engagement with a slot formed in the side fringe of a corresponding plate portion of one printed circuit base block and the other of which is adapted for engagement with a like slot formed in the side fringe of a like plate portion of the other printed circuit base block.

Figure 18:
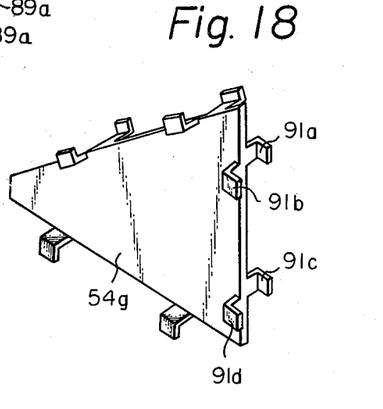

A variant of the foregoing holder is shown in FIG. 18, in which a triangular holder 54g is provided with four sets of L-shaped hooks 91a to 91d formed integrally in one body with every side fringe thereof. On a common side fringe of the holder 54g, two hooks 91a and 91c project on one side and are adapted for engagement with one printed circuit base block whereas two hooks 91b and 91d project on the other side and are adapted for engagement with the other printed circuit. The four hooks 91a to 91d are formed at different positions along the common side fringe of the holder 54g. Therefore, the holder 54g of this embodiment is well suited for manufacturing by mechanical pressing. Although the illustrated construction is used for a printed circuit base block including two plate portions, it can be used for the base block made up of three plate portions by forming like L-shaped hooks on the remaining, i.e. the lower side fringe of the holder 54g.

Figure 19:
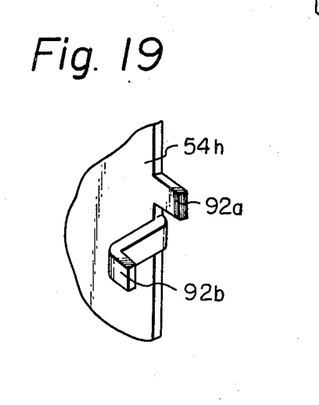
FIG. 19 is a fragmentary perspective view of a further modified embodiment of the holder used for the printed circuit base block shown in FIG. 16.

A variant of the foregoing holder is shown in FIG. 19, in which a like holder 54h is provided with a straight hook 92a and an L-shaped hook 92b in pair to each other and formed integrally of the side fringe thereof. The straight hook 92a is adapted for engagement with one printed circuit base block and the L-shaped straight hook 92b is adapted for engagement with the other printed circuit base block. Since the hooks 92a and 92b are formed at different positions along a common side fringe of the holder 54h, this contruction is suited for manufacturing by mechanical pressing also.

In accordance with the present invention, electric operation components can be very easily and rapidly mounted to the chassis by a single action without any need for screw fastening. High precision in position of the electric operation components on the chassis is assured only by correctly positioning mounting apertures receptive of the electric operation components on the chassis. Concurrently with the above-described mounting of the electric operation components to the chassis, electric connection can be established between the electric operation components and an associated electric circuit or circuits. These in combination lead to appreciable saving in operation and time needed for construction of electric devices and, thus, to remarkable lowering in manufacturing cost. No need for use of a number of lead wires greatly simplifies the construction. This is particularly advantageous on electric devices which are provided with very small free spaces behind the front panels. Further, the collective mounting of the electric operation components to the front panels of electric devices requires no special and individual adjustment in position of the electric operation components after mounting to the front panels. The collective mounting of the electric operation components further simplifies possible faculty checking during long use of the electric devices. Refined arrangement of the electric operation components on the front panels well contributes to betterment in appearance and commercial value of the electric devices to which the present invention is applied.

I claim:

1. An operation unit for electric devices comprising a plurality of electric operation components each having at least one electric terminal,
a chassis provided with a plurality of mounting apertures receptive of said electric operation components,
at least one printed circuit base block comprised of a first plate portion having at least a printed circuit and a second plate portion bent rearwards from said first plate portion, said first plate portion facing said chassis and having at least one through hole receptive of said electric terminal of said electric operation component and in communication with an electrically conductive layer forming said printed circuit, and said second plate portion being provided with at least one printed circuit,
said first and second plate portions having respective side fringes, means coupling said chassis to said printed circuit base block including a holder firmly but separably in engagement with said side fringes of said first and second plate portions, and
means for mounting said chassis to a panel of an electric device.

2. An operation unit for electric devices as claimed in claim 1 in which each of said electric operation components is provided with a means placing each said electric operation component in snap engagement with a corresponding said mounting aperture of said chassis.

3. An operation unit for electric devices as claimed in claim 2 in which said placing means include
a front portion whose transverse contour is somewhat larger than the contour of said corresponding mounting aperture of said chassis,
a rear portion removably located in said corresponding mounting aperture of said chassis,
at least one resilient skewed locking flap extending from said rear portion towards said front portion and having a free end which projects beyond said contour of said mounting aperture when said electric operation component is in snap engagement with said corresponding mounting aperture of said chassis.

4. An operation unit for electric devices as claimed in claim 1, in which
said coupling means include at least one rear hook projecting on the rear side of said chassis and in separable engagement with a corresponding engaging aperture formed in said first plate portion.

5. An operation unit for electric devices as claimed in any of claims 1, 2 or 3 in which said chassis has a fringe and said mounting means include at least one L-shaped fixture disposed to said fringe of said chassis.

6. An operation unit for electric devices as claimed in any of claims 1, 2 or 3 further comprising an auxiliary socket inserted between said electric operation component and said printed circuit base block for electrically connecting the two elements.

7. An operation unit for electric devices as claimed in claim 1 in which said first and second plate portions meet along a mating border, and elongaged groove is formed along said mating border of said said first and second plate potions.

8. An operation unit for electric devices as claimed in claim 7 in which a plurality of cut-outs are formed in said elongated groove while being spaced from each other.

9. An operation unit for electric devices as claimed in claim 1, wherein said printed circuit base block further comprises a third plate portion bent rearward from said first plate portion and spaced away from said second plate portion, said third plate portion also being provided with printed circuits,
said third plate portion having respective side fringes, said coupling means include said holder firmly but separably being in engagement with said side fringes of said third plate portion.

10. An operation unit for electric devices as claimed in claim 9 in which said first and second plate portions meet along one mating border and said first and second plate portions meet along one second mating border, elongated grooves are formed along said mating borders of said three plate portions.

11. An operation unit for electric devices as claimed in claim 10 in which a plurality of cut-outs are formed in at least one of said elongated grooves while being spaced from each other along that said groove.

12. An operation unit for electric devices as claimed in either of claims 1 or 9 in which said holder is a substantially triangular flat plate having means for engaging said holder with said plate portions.

13. An operation unit for electric devices as claimed in claim 12 in which said holder has fringes and said engaging means include hooking projections formed on said fringes of said holder and mating with said plate portions.

14. An operation unit for electric devices as claimed in either of claims 1 or 9 in which said holder is an elongated strap having a front end which is fixed to said first plate portion and a rear end which is in engagement with the rear ends of the remaining said plate portions which said rear ends are the ends not forming mating borders.

15. An operation unit for electric devices as claimed in claim 14 in which
said holder is provided with at least one resilient fastener formed at said rear end thereof, said fastner comprising a pole and at least a flaring end bulge, and
at least one said plate portion is provided with at least one engaging aperture whose contour is larger than that of said pole but smaller than that of said flaring end bulge.

16. An operation unit for electric devices as claimed in either of claims 1 or 9 in which said holder is a substantially horseshoe-shaped flat plate having means for engaging said holder with said plate portions and having a cut-out opening facing rearwards away from said claims.

17. An operation unit for electric devices as claimed in claim 16 in which said holder has fringes and said engaging means include hooking projections formed on said fringes of said holder and mating with said plate portions.

18. An operation unit for electric devices as claimed in claim 16 in which
said holder is accompanied by a horseshoe-shaped lead wire holder snugly received in said cut-out opening and having a second respective cut-out opening rearwards, and
said lead wire holder is accompanied by a resilient U-shaped attachment snugly disposed to said second cut-out opening and having a pair of lead wire hooks projecting into the rear opening of said second cut-out opening.

19. An operation unit for electric devices as claimed in claim 12 in which
at least two printed circuit base blocks are provided, and
said holder is provided with means for connecting said printed circuit base blocks in side-by-side relationship.

20. An operation unit for electric devices as claimed in claim 19 in which
said connecting means include a plurality of channel-shaped hooks disposed to the fringes of said holder and having bent rims projecting on different sides of said holder.

21. An operation unit for electric devices as claimed in claim 19 in which
said connecting means include a plurality of L-shaped hooks formed integrally with said fringes of said holder, and
said hooks project on different sides of said holder at different positions along said fringes.

22. An operation unit for electric devices as claimed in claim 14, in which
at least two printed circuit base blocks are provided, and
said holder is provided with means for connecting said printed circuit base blocks in side-by-side relationship.

* * * * *